United States Patent [19]

Torok et al.

[11] 3,964,034

[45] June 15, 1976

[54] OLIGATOMIC FERROMAGNETIC FILM MEMORY SYSTEM UTILIZING FIELD STABILIZED DOMAINS

[75] Inventors: Ernest J. Torok, St. Paul; Roger E. Lund, Cottage Grove; William J. Simon, Shakopee, all of Minn.

[73] Assignee: Sperry Rand Corporation, New York, N.Y.

[22] Filed: July 1, 1974

[21] Appl. No.: 484,833

[52] U.S. Cl. .................... 340/174 TF; 340/174 M; 340/174 PM; 340/174 SB

[51] Int. Cl.[2] ........................................ G11C 11/14

[58] Field of Search..... 340/174 TF, 174 M, 174 SB

[56] References Cited

UNITED STATES PATENTS

| | | | |
|---|---|---|---|
| 3,427,600 | 2/1969 | Middelhock | 340/174 TF |
| 3,454,939 | 7/1969 | Michaelis | 340/174 TF |
| 3,480,928 | 11/1969 | Kaske | 340/174 TF |
| 3,550,101 | 12/1970 | Lo et al. | 340/174 TF |

OTHER PUBLICATIONS

Bell Labs Records "The Magnetic Bubble" by Bobeck, June/July 1970, pp. 163–169.

*Primary Examiner*—James W. Moffitt
*Attorney, Agent, or Firm*—Kenneth T. Grace; Thomas J. Nikolai; Marshall M. Truex

[57] ABSTRACT

A method of operating and an apparatus comprising a very compact, bit-organized nondestructive readout (NDRO) random-access magnetic memory system is disclosed. The memory system is directed toward an improvement of the memory system of the D. S. Lo, et al., U.S. Pat. No. 3,550,101 and includes a continuous oligatomic ferromagnetic film (a film that is too thin to permit either Bloch walls or cross-tie walls, but does permit Neel walls) that has the property of uniaxial anisotropy which property provides an easy axis in the plane of the film along which the film's remanent magnetization may be aligned in either of two opposed information states and a hard axis in the plane of the film that is perpendicular to the easy axis. The film is initially saturated in a first direction along the easy axis while provided in the plane of the film are static, alternating-directioned parallel and antiparallel bias fields: parallel to the first direction in the vicinity of the memory areas as defined by the intersections of superposed, orthogonal word lines and sense-digit lines and antiparallel to the first direction in the areas between the memory areas. The bias field converts the magnetic domain of the D. S. Lo, et al., patent into a field stabilized domain, analogous to a bubble domain, in which the bias field and the demagnetizing field of the field stabilized domain stabilize the field stabilized domain against disturbing magnetic fields.

10 Claims, 17 Drawing Figures

OLIGATOMIC FERROMAGNETIC FILM MEMORY SYSTEM UTILIZING FIELD STABILIZED DOMAINS

BACKGROUND OF THE INVENTION

In the memory system of the D. S, Lo, et al., patent, teaching of which is incorporated herein by reference thereto, there is disclosed an oligatomic ferromagnetic film which film is continuous in two orthogonal directions, and which has uniaxial anisotropy providing an easy axis in the plane of the film along which the film's magnetization may be aligned either parallel or antiparallel. Writing of information into the film is accomplished by applying to a small memory area, which area is located at the intersection of a word line and a digit line, a combination of two fields: from the word line an AC hard axis drive field of frequency $f$ of an amplitude that is less than the reversible limit $H_R$ of the memory area; from the digit line, a DC easy axis drive field of a magnitude that is less than the coercive force $H_C$ of the memory area. If the magnetization was previously in the state opposite to the direction of the field from the digit line the memory area is switched (remagnetized) to the opposite information state by the stray field enhanced sequential rotation process. The direction of the resulting remanent magnetization depends on the polarity of the DC easy axis drive field. Non-destructive readout is accomplished by applying the same AC hard axis drive field to the memory area and detecting, on a hard axis aligned sense line, an output signal of frequency $2f$.

Subsequent investigation of the switching mechanism of the D. S. Lo, et al., memory system has indicated that the switching astroid is not symmetrical about the orthogonal $H_L$, $H_T$ axes, and, accordingly, the magnetic domain is subject to erasure under repeated read cycles or to propagation along the word line into the next adjacent memory area. The present invention is directed toward a method of and an apparatus for converting the less stable magnetic domain of the D. S. Lo, et al., patent into a more stable bubble domain using the field stabilizing domain's demagnetizing field and static, alternating-directioned bias fields that lie in the plane of the film and that are substantially parallel or antiparallel to the film's remanent magnetization which is aligned along the film's easy axis.

SUMMARY OF THE INVENTION

The memory system of the present invention includes an oligatomic ferromagnetic film, which is continuous in two orthogonal directions and which film has uniaxial anisotropy providing an easy axis in the plane of the film along which the film's remanent magnetization may be aligned, either parallel or antiparallel, and a hard axis in the plane of the film that is perpendicular to the easy axis. A matrix array of orthogonal sets of parallel word lines and parallel sense-digit lines are oriented parallel, superposed the plane of the film which film is saturated in a first magnetic direction along the easy axis and which lines define a memory area in the film at each word line, sense-digit line intersection. The word lines are aligned substantially parallel to the easy axis of the film, providing a substantially transverse $H_T$ or hard axis drive field while the sense-digit lines are aligned substantially parallel to the hard axis of the film, providing a substantially longitudinal $H_L$ or easy axis drive field. Additionally provided in the plane of the film are static (continuous), alternating-directioned bias fields; substantially parallel to the first magnetic direction in the memory areas and substantially antiparallel to the first magnetic direction in the areas between the memory areas.

In the preferred embodiment, the orthogonal (longitudinal) axes of the word lines and of the sense-digit lines are rotated slightly out of parallel alignment, e.g., 10°, with the orthogonal easy axis and the hard axis, respectively, of the film. The static $H_L$ bias field $H_B$ establishes the operating point for the following operating fields:

a. AC word drive field $H_T$, b. Pulsed DC word drive field $H_T$, c. Bipolar digit drive field $\pm H_L$.

The AC word drive field $H_T$ and the pulsed DC word drive field $H_T$ provide readout of information stored in the memory area while the AC word drive field $H_T$ and the pulsed DC word drive field $H_T$ and the digit drive field $\pm H_L$ write the information into the memory area ($+H_L \Rightarrow 1, -H_L \Rightarrow 0$).

Figure 11:
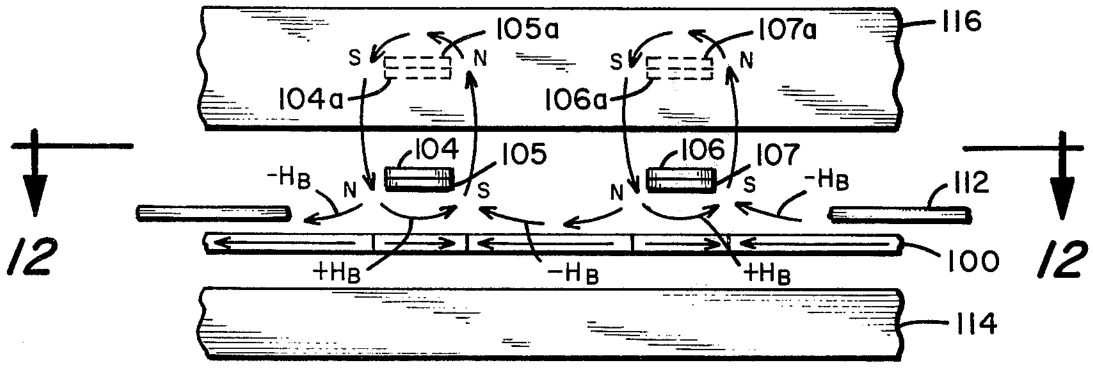
FIG. 11 is an exploded view, taken normal to the plane of the digit lines, of a second embodiment of a memory system incorporating the present invention.

FI. 12 is a partial plan view of the memory system of FIG. 11 taken along line 12—12.

Figure 6A:
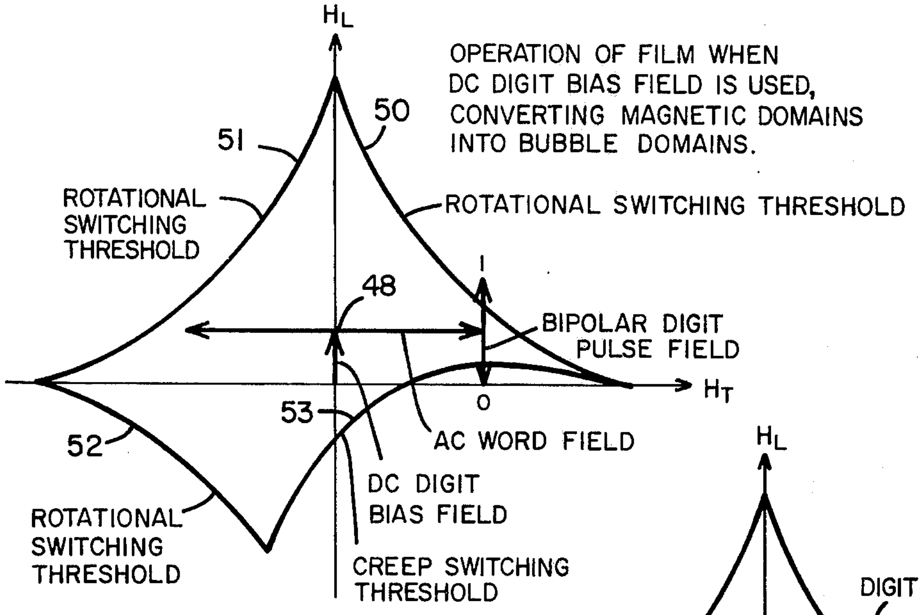
FIGS. 6*a*, 6*b*, 6*c* are slots of the switching curve of the oligatomic erromagnetic film of FIG. 4 and three different drive field combinations.
Figure 6B:
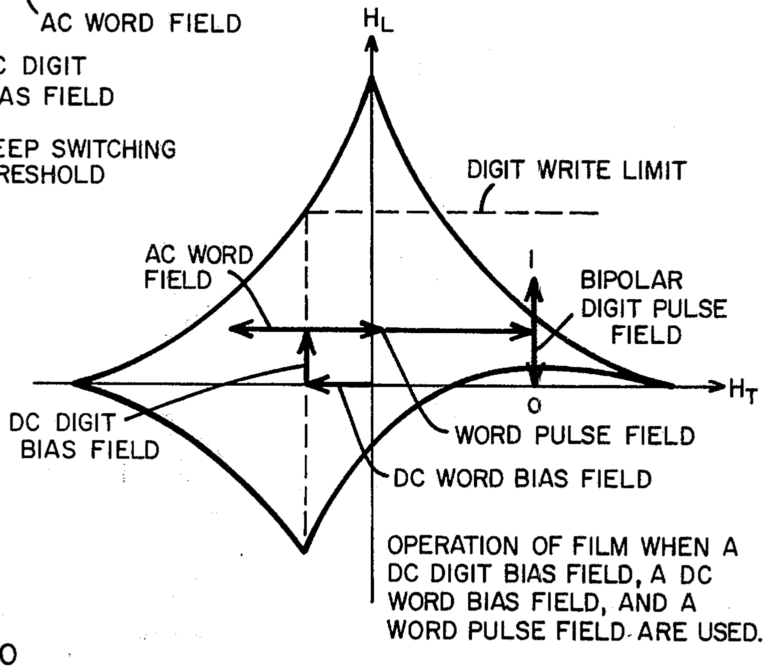
Figure 6C:
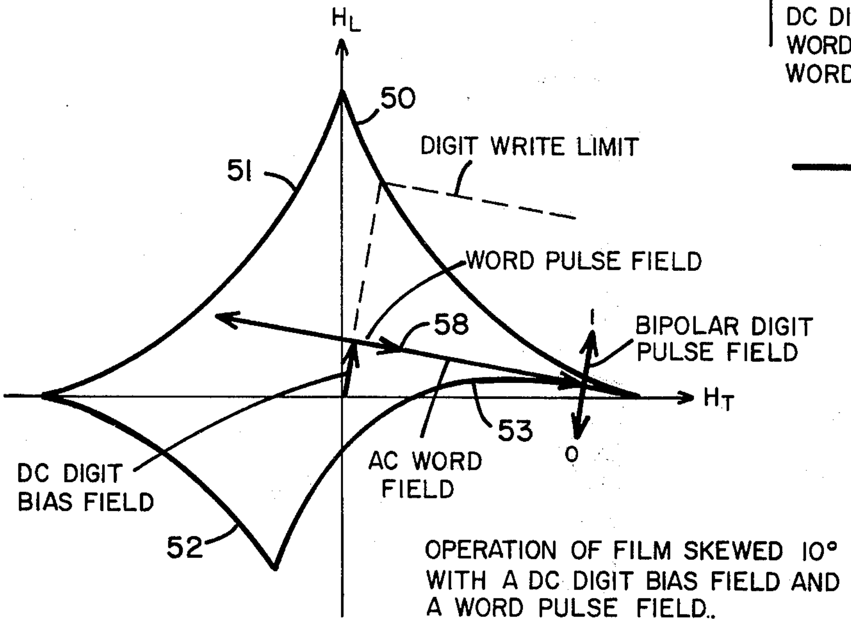
Figure 13A:
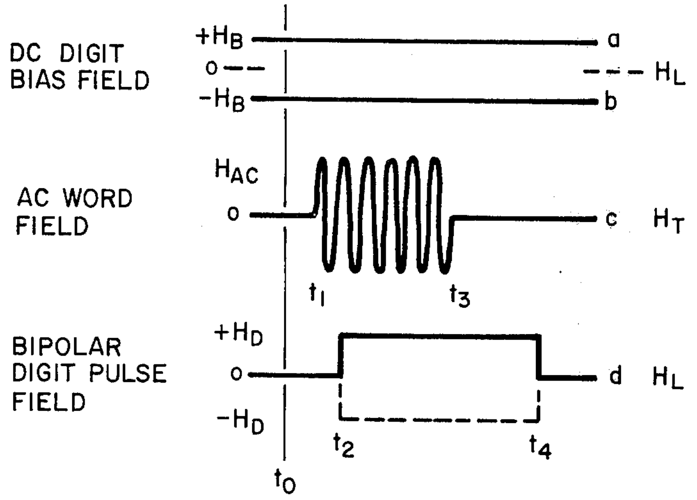
Figure 13B:
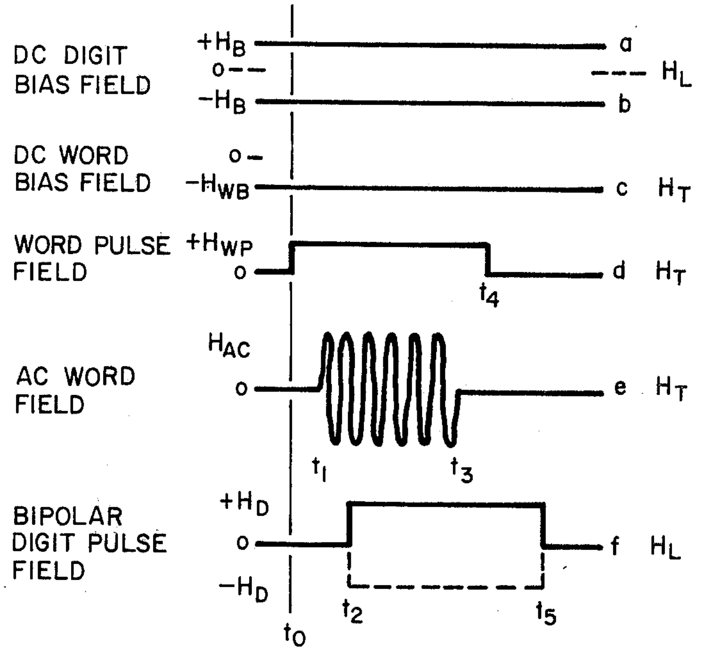
Figure 13C:
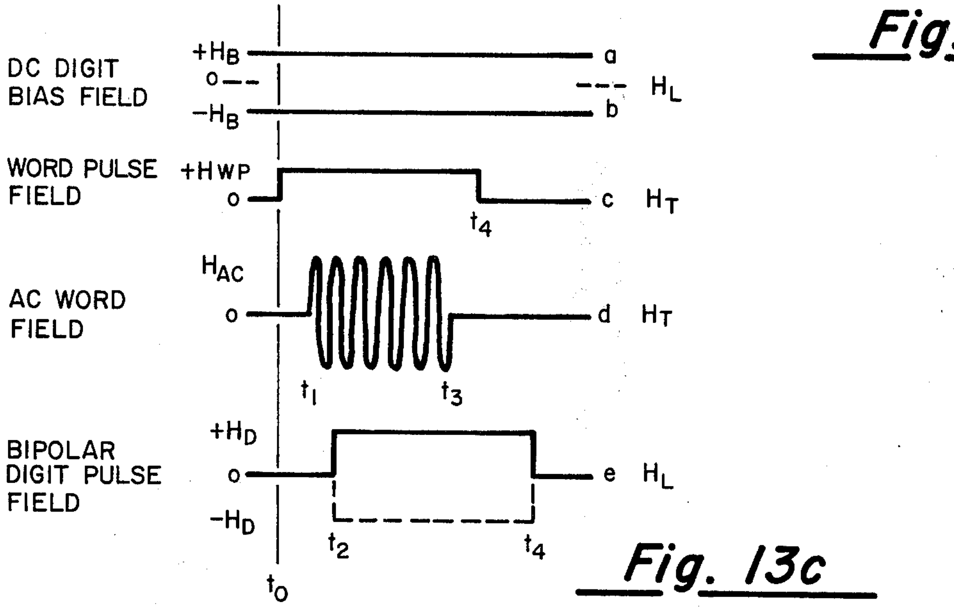

FIGS. 13*a*, 13*b*, 13*c* are timing diagrams of the drive fields associated with the switching curves of FIGS. 6*a*, 6*b*, 6*c*, respectively.

DESCRIPTION OF THE PREFERRED EMBODIMENTS

Field stabilized domains have in the past been known to exist in thin orthoferrite or garnet films — see the publication "Magnetic Bubbles," A. H. Bobeck, et al., Scientific American, September, 1970, pp. 78–90, and in narrow strips of thin ferromagnetic film — see the publication "Stable Reversal Domains in Thin Film strips," T. J. Nelson, et al., AIP Conference Proceedings, No. 5, Magnetism and Magnetic Materials, 1971, 17th Annual Conference, pp. 150–154. For purposes of the present invention, let a field stabilized domain be defined as a magnetic domain that is stabilized by a combination of a bias field and its own demagnetizing field and would be stable even if the coercivity of the magnetic field were zero, i.e., $H_C=0$ are bubble domains field stabilized domains.

Figure 1:
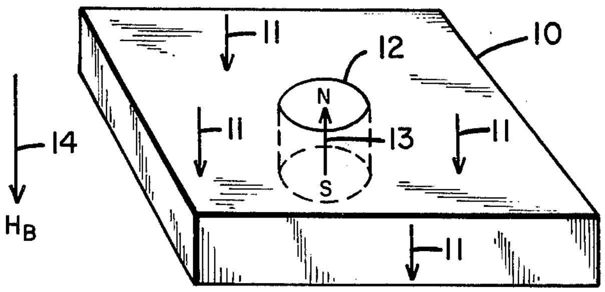
PRIOR ART Fig. 1
FIG. 1 is a diagrammatic illustration of a prior art bubble domain as established in a continuous thin film of orthoferrite or garnet.

With particular reference to FIG. 1 there is presented a diagrammatic illustration of a continuous orthoferrite film 10 as taught by A. H. Bobeck, et al., in which its magnetization is established in a downwardly direction denoted by vectors 11. Within the film 10 there is caused to be written, by the known proper drive fields, a bubble domain 12 having its magnetization oriented in an upwardly direction denoted by vector 13 and stabilized by the external bias field $H_B$ denoted by vector 14.

Figure 2:
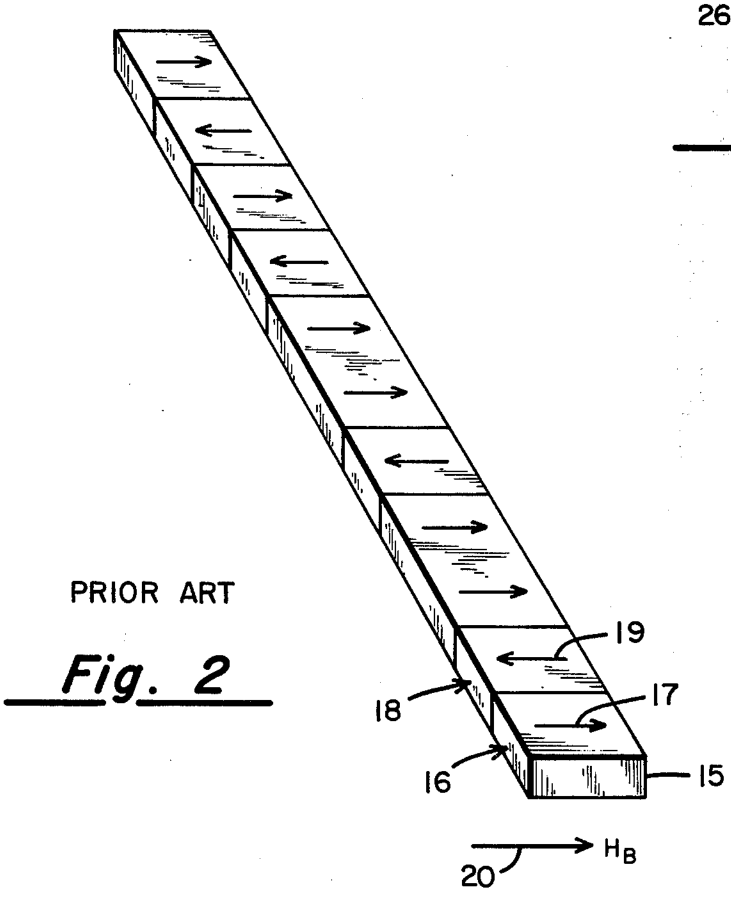
PRIOR ART Fig. 2
FIG. 2 is a diagrammatic illustration of a prior art field stabilized domain as established in a narrow strip of an oligatomic ferromagnetic film.

With particular reference to FIG. 2 there is presented a diagrammatic illustration of a narrow strip of thin ferromagnetic film 15 having uniaxial anisotropy providing an easy axis in the plane of film 15 that is orthogonal to the long edge thereof, all as taught by T. J. Nelson, et al. In this configuration the field stabilized domains 16, 18 are rectangular domains in which the magnetization thereof is established in the directions denoted by vectors 17, 19, respectively, aligned with the easy axis thereof in first or second and opposite directions in the plane of film 15 and stabilized by the external bias field $H_B$ denoted by vector 20.

Figure 3:
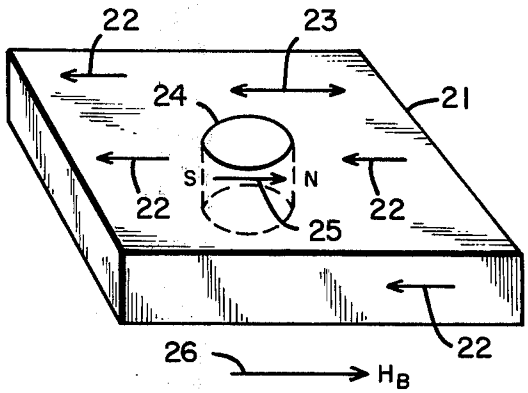
FIG. 3 is a diagrammatic illustration of a continuous oligatomic ferromagnetic film in which is established a field stabilized domain of the present invention.

In contrast to the priorly known bubble domain of FIG. 1 in the continuous thin orthoferrite film as taught by A. H. Bobeck, et al., and in the narrow strip of thin ferromagnetic film of FIG. 2 as taught by T. J. Nelson, et al., the present invention is directed toward the configuration of FIG. 3 in which there is presented a diagrammatic illustration of a thin ferromagnetic film 21 that is continuous (in two orthogonal directions) and that has its magnetization established in the direction denoted by vectors 22 in the plane of the film and aligned with its easy axis 23 established by the well-known property of uniaxial anisotropy. In conformance with the method of the present invention there is established in continuous film 21 the field stabilized domain 24 having a canoe-like cross-section extending through the thin dimension of the film 21 and having the magnetization therein established in a direction antiparallel to that of vectors 22 as denoted by vector 25. The present invention utilizes the know-how of the above-referenced D. S. Lo, et al., patent converting the magnetic domain thereof into a field stabilized domain in which static, alternating-directioned parallel and anti-parallel bias fields and the demagnetizing field of the field stabilized domain stabilize the bubble domain against operating and external magnetic fields that would otherwise tend to destroy its informational significance.

Figure 4:
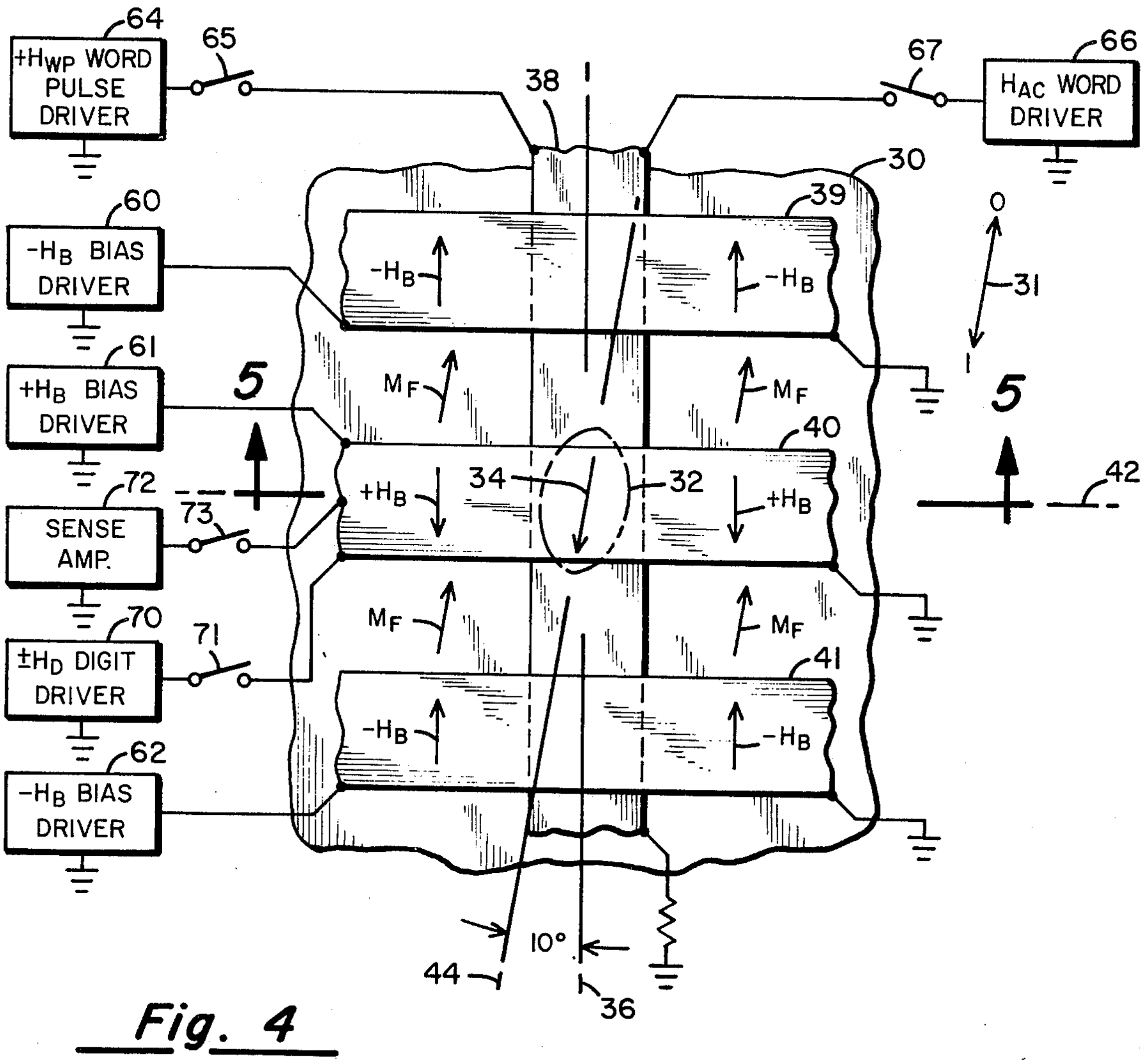
FIG. 4 is a plan view of a preferred embodiment of the present invention.

With particular reference to FIG. 4 there is presented a plan view of an illustration of a preferred embodiment of the present invention. The preferred embodiment of the present invention utilizes, for the storage medium, a continuous thin-ferromagnetic-film layer 30 of approximately 81% Ni-19% Fe of a thickness of, e.g., 100 angstroms (A). The thickness of film 30 is limited to such small thickness (in the order of 50 A to 250 A) that it is insufficient to permit interdomain Bloch walls or cross-tie walls and has the property of uniaxial anisotropy providing an easy axis 31 in the plane of film 30 along which the magnetization thereof is aligned in the 0 direction as denoted by vectors $M_F$.

Information is written into film 30 in the form of a canoe-like field stabilized domain 32 in which the magnetization thereof is aligned parallel to easy axis 31 in the 1 direction denoted by vector 34 which vector 34 is antiparallel to vector $M_F$ that represents the orientation of the magnetization of film 30 except in the memory area denoted by field stabilized domain 32. Inductively coupled to film 30 and having a longitudinal axis 36 is a word line 38 and a sense-digit line 40 having its longitudinal axis 42 oriented perpendicular to longitudinal axis 36 of word line 38. The intersection of word line 38 and sense-digit line 42 operate to define the memory area in which is located the associated field stabilized domain 32 while, for purposes as will be subsequently discussed, longitudinal axis 36 is oriented at an optimum angle of 10° (an operable range of 5°–20° has been observed) to axis 44 which axis is parallel to easy axis 31 of film 30.

Figure 5:
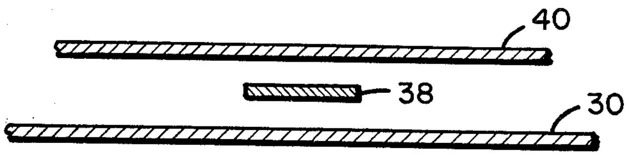
FIG. 5 is a cross-sectional, exploded view of the embodiment of FIG. 4 taken along line 5—5.

With particular reference to FIG. 5 there is presented a cross-section of the memory system of FIG. 4 taken along line 5—5 of FIG. 4 for purposes of illustrating the superposed nature of film 30, word line 38 and sense-digit line 40. Because of the relative sizes of the elements illustrated therein, it is to be appreciated that the illustrated embodiment of FIGS. 4, 5 is presented for a general description only, it being understood that relative dimensions are not intended nor are the other essential but non-active elements of an operative memory system illustrated for clarity.

Figure 7:
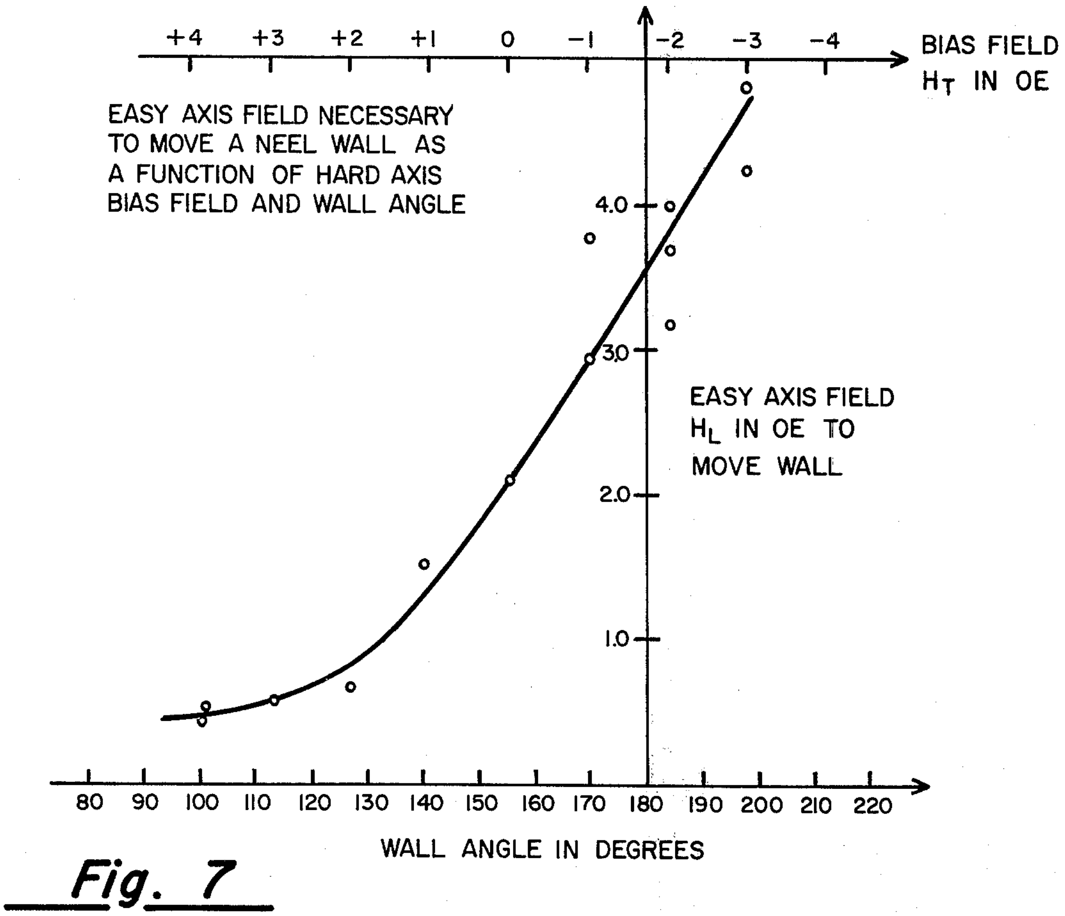
FIG. 7 is a plot of the easy axis field necessary to move a Néel wall as a function of the hard axis bias field and wall angle of a field stabilized domain.

With particular reference to FIGS. 6*a*, 6*b*, 6*c* there are illustrated the switching curve of an oligatomic ferromagnetic film and three different drive field combinations. In FIG. 7 there is illustrated a curve, taken on a 120 A Permalloy film in an electron microscope, of an easy axis drive field $H_L$ necessary to move a Neel wall as a function of hard axis bias field $H_T$ and wall angle. FIG. 7 illustrates that a positive hard axis bias field $H_T$ makes the Neel wall a small angle wall, which small angle wall has a low energy level and, accordingly, can be easily moved. In contrast, a negative hard axis bias field $H_T$ makes the Néel wall a large angle wall, which large angle wall has a high energy level, and, accordingly, requires a large easy axis drive field $H_L$ to move it. This asymmetry of the field required to move the wall explains the asymmetry between positive and negative hard axis fields of FIGS. 6*a*, 6*b*, 6*c*.

There is also an asymmetry between positive and negative easy axis fields in the switching threshold curves of FIGS. 6*a*, 6*b*, 6*c*. This is because once a domain has been written into a film there is a demagnetizing field from the poles at the ends of the domain that tends to erase the domain. The shorter the domain, the closer the poles are together and the stronger the demagnetizing field. The curves of FIG. 6 are taken from domains so short that they can erase themselves with word current alone. Outside the domain beyond the tip, the demagnetizing field reverses direction and may cause the tip to extend to an adjacent bit position. To prevent these evils, a bias field is required. The essence of the required easy axis bias field $H_L$ is that it be positive under the digit line in the area interior to the domain so as to prevent the field stabilized domain from collapsing and that it be negative at some point between digit lines so as to prevent the field stabilized domain from becoming too long and extending into adjacent memory areas along the word line.

Figure 10:
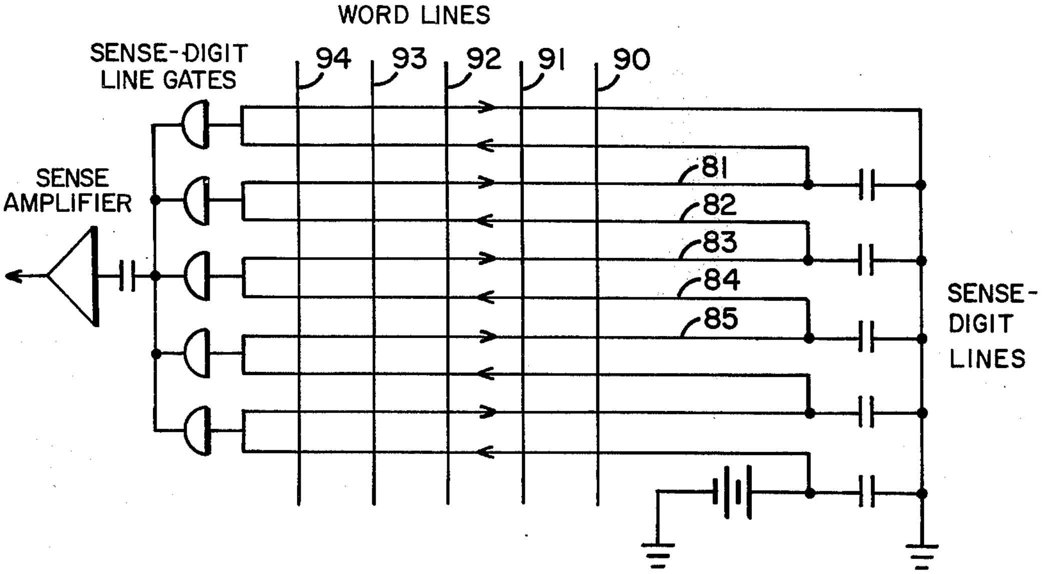
FIG. 10 is an illustration of one possible method of implementing the bias current signal version of FIGS. 8, 9.
Figure 8:
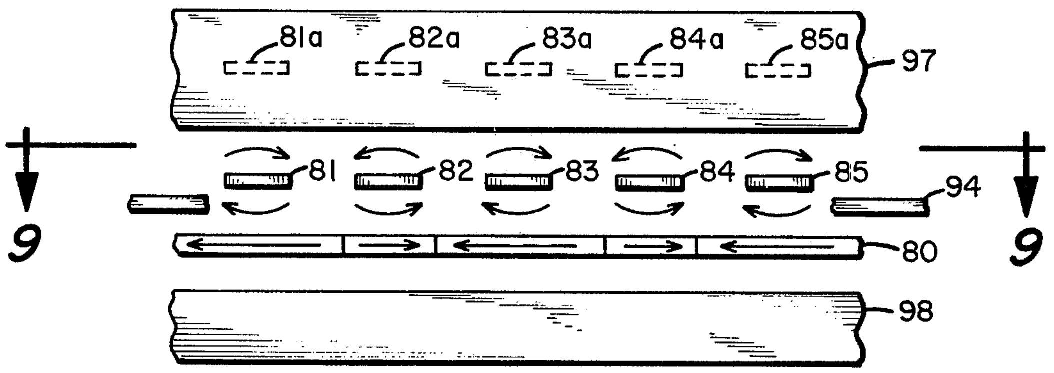
FIG. 8 is an exploded end view taken normal to the plane of the digit lines of a first embodiment of a memory system incorporating the present invention.
Figure 9:
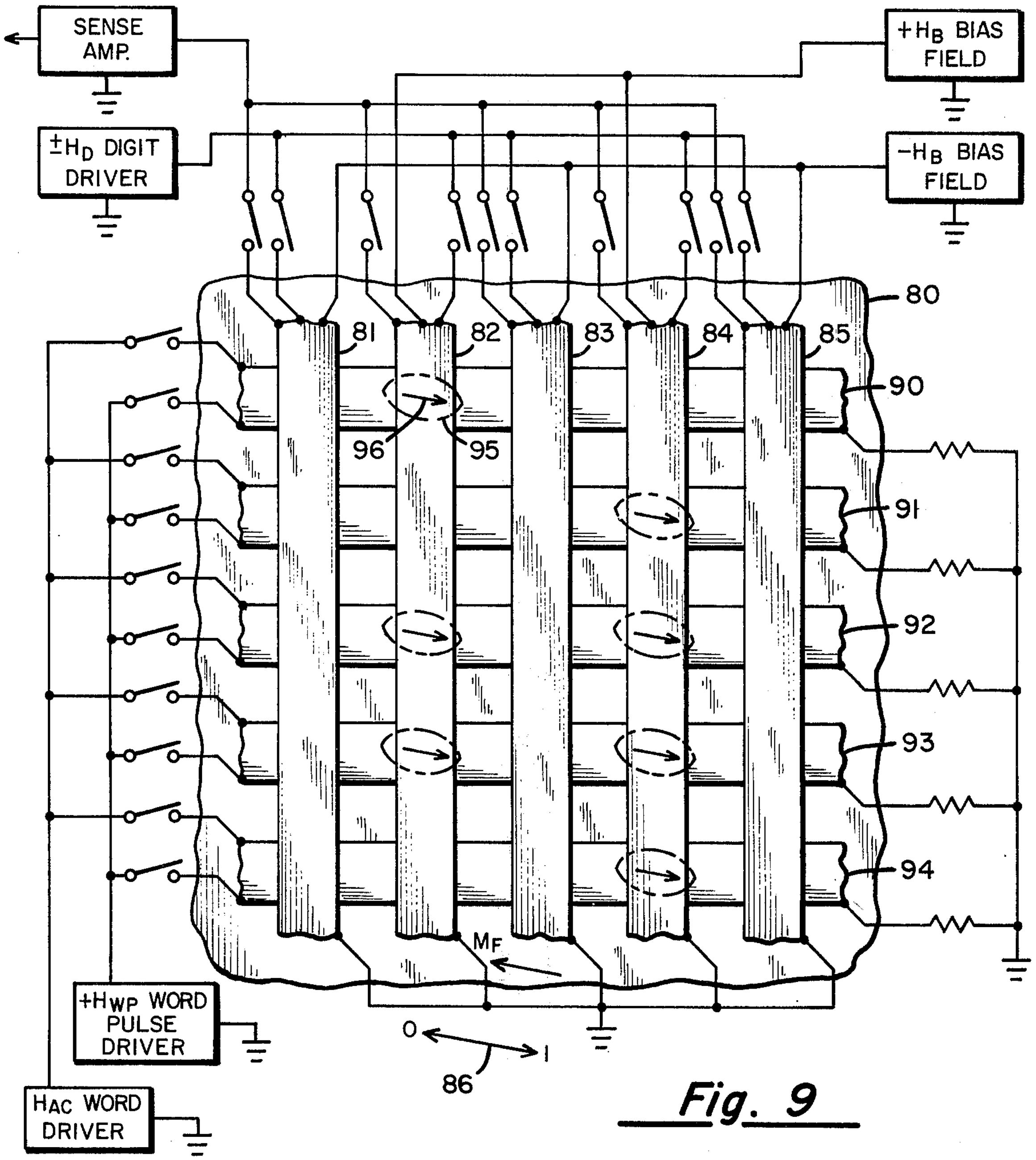
FIG. 9 is a partial plan view of the memory system of FIG. 8 taken along line 9—9.
Figure 12:
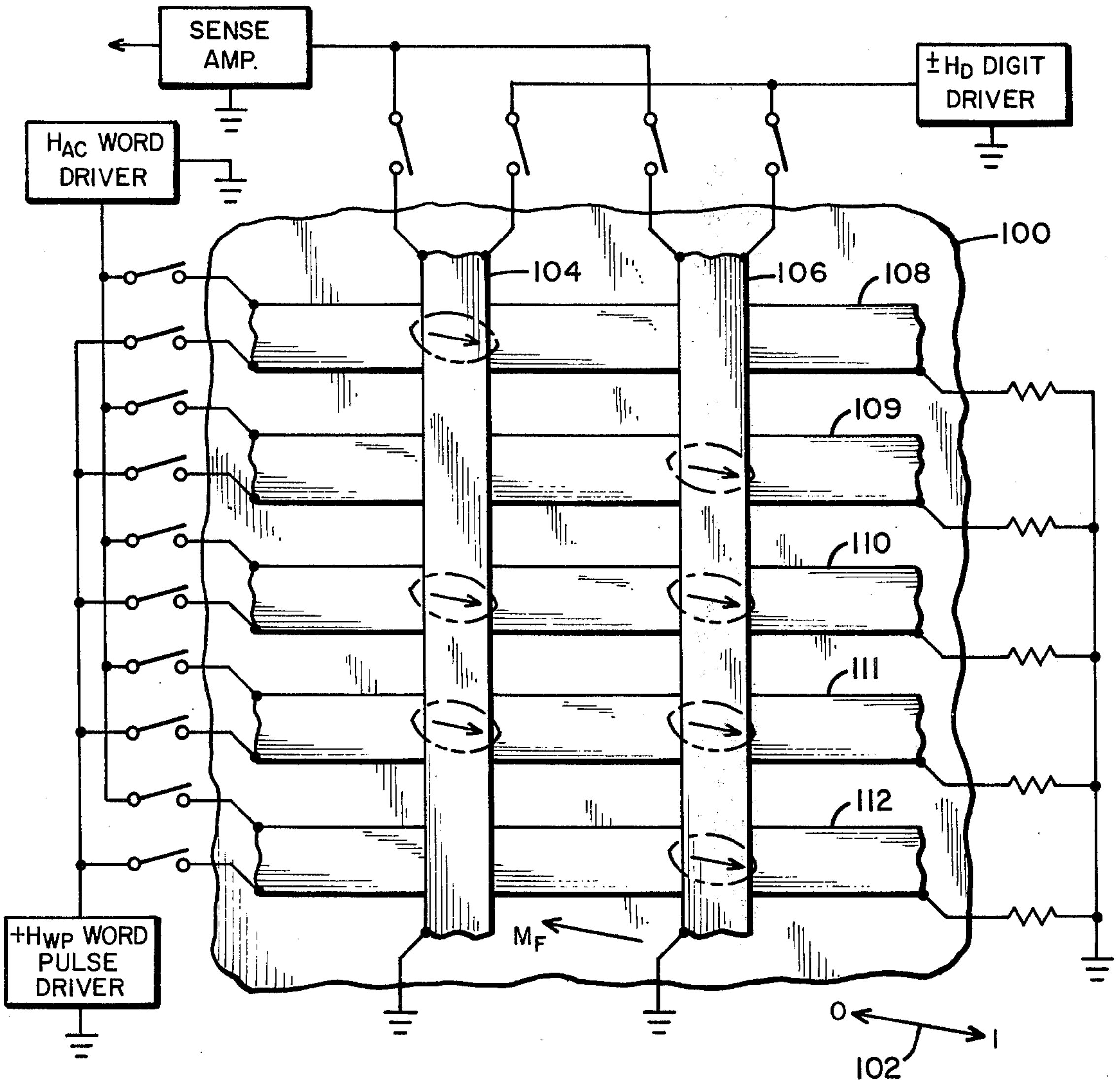

Two methods of providing such easy axis field $H_L$ are illustrated in FIGS. 8, 9, 10 and FIGS. 11, 12. The method of FIGS. 8, 9, 10 is to provide a + DC bias current signal in the digit lines and an equal and opposite — DC bias current signal in the interstitial digit lines. In contrast, the method of FIGS. 11, 12 is to plate the digit lines with a permanent magnet material such as cobalt. The cobalt layer is permanently magnetized (saturated with a large field parallel to the plane of the film and perpendicular to the longitudinal axis of the digit lines in the area of the memory areas thus forming digit strip lines — no interstitial digit lines are required. North poles form on one edge of each strip line while south poles form on the opposing edge; the alternating north and south poles generate a spatially alternating-directioned bias field $+H_L, -H_L, +_L$, etc. One possible method of implementing the bias current version of FIGS. 8, 9 is illustrated in FIG. 10.

With reference back to FIGS. 6*a*, 6*b*, 6*c* and the related timing diagrams of FIGS. 13*a*, 13*b*, 13*c*, respectively, a memory system somewhat similar to that of FIGS. 4, 5 was utilized for test purposes. With respect to FIG. 6*a*, there is presented an illustration of a plot of the noted drive fields of FIG. 13*a* upon the switching curve of a memory system somewhat similar to that of FIG. 4 in which:

- digit lines 39, 40, 41 were 0.003 inch wide on 0.006 inch center line to center line spacings with alternate digit lines 39, 41 used as interstitial bias digit lines,
- word line 38 was 0.003 inch wide (on 0.010 inch center line to center line spacings with other word lines not illustrated),
- positive (field stabilized domain aiding) bias current of 12 milliamperes (ma) was coupled to digit line 40,
- negative (field stabilized domain opposing) bias current of 12 ma was coupled to the interstitial bias digit lines 39, 41,
- word line 38 was oriented parallel to easy axis 31,
- digit lines 39, 40, 41 were oriented perpendicular to word line 38.

The following drive fields as noted in FIGS. 6*a*, 13*a*, were utilized:

DC digit line $H_L$ (bias) field, $+H_B$, $-H_B$;

AC word line $H_T$ (read/write) field, $H_{AC}$,

Bipolar digit line $\pm H_L$ (write), $+H_D$, $-H_D$, pulse field;

$$+H_D \Rightarrow 1$$

$$-H_D \Rightarrow 0.$$

Note that the use of the positive DC digit bias field $+H_B$ establishes the operating point 48 about which the AC word field $H_{AC}$ moves within the switching curve defined by the rotational switching curves 50, 51, 52 and the creep or wall switching curve 53 to achieve non-destructive switching of the memory area. The digit pulse field $+H_D$ is utilized to write the memory area into a field stabilized domain 32 representative of the writing of a 1 denoted by vector 34 or the bipolar digit pulse $-H_D$ is utilized to erase the field stabilized domain 32 representative of the writing of a 0 by establising the magnetization of the memory area into the remanent magnetic state denoted by vectors $M_F$. Note, a film with zero coercivity, $H_C = 0$, could not be operated according to the method of the D. S. Lo, et al., patent. However, using the method of FIG. 6*a* the magnetic domains of the D. S. Lo, et al., patent were converted into field stabilized domains wherin the AC word field operating margins of one film were increased ±22%.

With respect to FIG. 6*b*, there is presented an illustration of a plot of the noted drive fields of FIG. 13*b* upon the switching curve of a memory system somewhat similar to that of FIGS. 4, 5 as discussed with reference to FIG. 6*a* above. In this configuration, in addition to the drive fields utilized and discussed above with reference to FIGS. 6*a*, 13*a* here we utilized a DC word line bias $H_T$ (read/write) field, $-H_{WB}$, Word line pulse $H_T$ (read/write) field, $+H_{WP}$.

The purpose of this configuration is as follows. The digit line (easy axis or $H_L$) field required to move a Neel wall depends strongly on the wall angle. A 90° wall is wider and has less energy stored therein than a 180° wall which is wider than and has less energy store therein than a 270° wall. This is illustrated in the graph of FIG. 7; the larger the wall angle, the larger the coercivity $H_C$, which means that a field stabilized domain may be stabilized by applying a reverse or negative hard axis bias field which increases the wall angle. Accordingly, the film was tested with a negative DC word bias field generated by a current signal of 9 ma coupled to word line 38. The AC word field was then accompanied by a superposed positive word pulse field to ensure that all Néel walls were of the proper sense, i.e., that all Néel walls are created by crossing the right hand side of the switching curve of FIG. 6*b*. In this configuration it was determined that the AC word field margins were increased ±34%; however, the digit field margins were lowered ±11% while the digit field current required to disturb the informational state of the memory area was raised to 27 ma. Looking at FIG. 6*b* indicates that a pure digit field disturb in the upward or plus $H_L$ direction is no longer in the peak of the switching curve, i.e., along the $H_T = 0$ axis, but is displaced to the left. Thus, the increase in immunity to negative (tending to erase a field stabilized domain) digit field disturb signals has been compensated for by a decrease in immunity to positive (tending to write a field stabilized domain) digit field disturb signals. Additionally, the increase in word field margins was accompanied by a decrease in digit field margins.

With respect to FIG. 6*c*, there is presented an illustration of a plot of the noted drive fields of FIG. 13*c* upon the switching curve of a memory system similar to that of FIGS. 4, 5 and as discussed with reference to FIGS. 6*a*, 13*a* above. In this configuration, in addition to the drive fields utilized and discussed with reference to FIGS. 6*a*, 13*a* there was utilized a, word line pulse $+H_T$ (read/write) field, $+H_{WP}$. Additionally, word line 38 was purposely skewed 10°, i.e., the longitudinal axis 36 of word line 38 was rotated 10°with respect to easy axis 31 of film 30 denoted by line 44. Additionally, sense-digit lines 39, 40, 41 were likewise rotated to be maintained in their perpendicular relationship to word line 38. The purpose of this rotation of the word lines, sense-digit lines with respect to the easy axis 31 of film 30 was three-fold: to increase the reversible limit, increase the immunity to negative (tending to erase a bubble domain) digit field disturb signals, and to provide the word line with an easy axis component so that coincident current erase of the field stabilized domain is possible even if the film has zero coercivity, $H_C = 0$.

One reason for skewing the word lines, sense lines 10° with respect to the easy axis of the film can be seen from FIG. 6*c*. If the film is not skewed with respect to the word line (as in FIG. 6*a*), the reversible limit of the film is low because the word line drive field in the presence of the digit line bias field is sufficient to write a field stabilized domain into the film when the vector sum of the two fields crosses the switching curve. However, if the film is skewed as in FIG. 6*c*, the word field can extend far down the channel between the two switching curves 50 and 53 without crossing them. Note that a small word pulse field $+ H_{WP}$ is added to ensure that all switching is done on the right side of the switching curve, where the hard axis or digit line drive field is $+ H_T$. A second reason for skewing the film is that a negative digit field disturb signal has a negative hard axis component that directs the drive field vector toward the lower left hand trough in the switching curve during digit field disturbs, thereby raising the disturb limits thereof. A third and most important reason for skewing the film is that this gives the hard axis field an easy axis component which component aids in rasing the field stabilized domain in such cases where the film has a very low coercivity. This easy axis component of the hard axis drive field makes coincident current operation possible for field stabilized domains in which the film has zero coercivity, $H_C = 0$. In this configuration word field margins were increased ±56% and the digit field margins were increased ±25%.

With reference back to FIGS. 4, 5, the drive field relationships of FIGS. **6*c*, 13*c* will be considered applicable to the preferred embodiment of the present invention. Initially, it will be understood that prior to, during and subsequent to read/write operation of the memory system of FIG. 4 $-H_B$ bias drivers 60, 62 couple a field stabilized domain erasing bias current signal to digit lines 39, 41, respectively, while $+H_B$ bias driver 61 couples a field stabilized domain aiding bias current signal to digit line 40. For the write operation as at time $t_O$, $+ H_{WP}$ word pulse driver 64 by means of switch 65 couples a word pulse field current signal to word line 38. Subsequent to time $t_O$ and while the word pulse field current signal is yet coupled to word line 38, $H_{AC}$ word driver 66 by means of switch means 67 couples, as at time $t_1$, the AC word field current signal to word line 38. The AC word field current signal is of a sinusoidal form having a preferred frequency $f$ in the range of 5 to 200 megahertz (mHz). The DC digit bias field $+ H_B$, which is an easy axis drive field, and the word pulse field $+ H_{WP}$, which is a hard axis drive field, vectorially cooperate to establish the operating point 58 of FIG. 6*c* about which the AC word field moves within the switching curve of FIG. 6*c*. Subsequently, as at time $t_2$ and while the word pulse field $+ H_{WP}$ and the AC word field $H_{AC}$ are concurrently coupled to the memory area defined by the intersection of word line 38 and digit line 40, $\pm H_D$ digit driver 70 by means of switch means 71 couples a positive digit pulse field $+ H_D$ current signal for the writing of a 1 or, alternatively, a negative digit pulse field $- H_D$ current signal for the writing of a 0, to digit line 40**.

It is to be understood that in the present discussion of FIGS. **4, 6*c*, 13*c*, and the subsequent discussion of FIGS. 8, 9, 10, 11, 12 the word drive fields and the digit drive fields are skewed substantially 10° with respect to the hard axis and the easy axis, respectively, of film 30; however, the terms hard axis drive field and easy axis drive field are to be retained for brevity. It is to be noted in FIG. 6*c* that the magnitudes of the DC digit bias field, of the word pulse field, and of the AC word field are such that the maximum extension to the left of the AC word field $- H_{AC}$ is well within the rotational switching threshold 51 while the AC word field $+ H_{AC}$ extends to the right into but not beyond the trough formed by rotational switching threshold 50 and creep switching threshold 53**.

Subsequent to the writing of field stabilized domain 32 into film 30 at the intersection of word line 38 and digit line 40, as during the time $t_2$–$t_3$, the AC word field current signal is decoupled from word line 38 as by means of switch means 67 as at time $t_3$. The word pulse field current signal is then decoupled from word line 38 as by means of switch means 65 as at time $t_4$ and then lastly the digit pulse field bias current signal is decoupled from digit line 40 as by means of switch means 71.

For the read operation, the above combination of word pulse field and AC word field inductively coupled to field stabilized domain 32 by their respectively associated word line and digit line, with no bipolar digit pulse field utilized for the read operation, whereby there is induced in digit line 40 and coupled to sense amplifier 72 by means of switch means 73 an AC output signal of frequency $2f$ as explained in the D. S. Lo, et al., patent. Tuned sense amplifier 72 detects the $2f$ output signal as being representative of the informational state of the memory area defined by the intersection of word line 38 and sense-digit line 40; the existence of a field stabilized domain 32 generates a significant amplitude $2f$ output signal as being indicative of the storage of a 1 while, conversely, the non-existence of a field stabilized domain 32 generates an output signal of opposite phase as being indicative of the storage of a 0.

With reference back to FIGS. 8, 9 there are presented an exploded end view normal to the plane of film 80 and digit lines 81, 82, 83, 84, 85 and a plan view, respectively, thereof. In this configuration as in that of FIGS. 4, 5 film 80 is an oligatomic ferromagnetic film of approximately 81% Ni - 19% Fe of a thickness of, e.g., 100 A. Film 80 has the property of uniaxial anisotropy providing an easy axis denoted by line 86 along which the magnetization is initially aligned throughout film 30 in the 0 direction as denoted by vector $M_F$. The parallel set of digit lines 81, 82, 83, 84, 85 and the parallel set of word lines 90, 91, 92, 93, 94 are arranged orthogonal to each other and are skewed at an angle of, e.g., 10°, with respect to the easy axis 86. The intersections of sense-digit lines 82, 84 and the word lines 90, 91, 92, 93, 94 define memory areas in film 80 in which field stabilized domains 95 are selectively written with their magnetization in the 1 direction, denoted by vector 96, antiparallel the 0 direction denoted by vector $M_F$. The interstitial digit lines 81, 83, 85 are utilized, as in FIG. 4, for providing the negative DC digit bias field $- H_B$ that tends to erase a field stabilized domain in the areas of film 80 between the sense-digit lines 82, 84 and for providing the positive DC digit bias field $+ H_B$ that tends to write or aid a field stabilized domain in the areas of film 80 under sense-digit lines 82, 84.

FIG. 8 illustrates that in this emodiment of the present invention the memory system includes a keeper layer 97 and a ground plane 98 sandwiching the superposed digit lines and word lines therebetween. Also illustrated are the clockwise, negative DC digit bias fields $- H_B$ about interstitial digit lines 81, 83, 85 and the counterclockwise positive DC digit bias fields around sense-digit lines 82, 84 that generate the field stabilized domain erasing and bubble domain aiding fields, respectively, in film 80 as denoted by the vectors thereunder. Also illustrated in keeper layer 97 are the magnetic images 81_a_, 82_a_, 83_a_, 84_a_, 85_a_ of the digit lines 81, 82, 83, 84, 85, respectively. By the selective coupling of the drive current signals as illustrated in FIGS. 6_c_, 13_c_, selected memory areas may have their magnetization switched from the 0 direction into the 1 direction in a bit-selectable manner. FIG. 10 is presented to illustrate one manner in which the negative DC digit bias fields $-H_B$ and positive DC digit bias fields $-H_B$ may be generated in the areas of digit lines 81, 83, 85 and sense-digit lines 82, 84, respectively.

With respect to FIGS. 11, 12, there is illustrated another embodiment of the present invention in which there is provided an oligatomic ferromagnetic film 100 having as in the embodiments of FIGS. 4, 9, the property of uniaxial anisotropy providing an easy axis 102 along which the magnetization of film 100 is aligned in the 0 direction as denoted by vector $M_F$ or the opposite 1 direction. In this embodiment there are no interstitial digit lines utilized to provide the negative DC digit bias field $-H_B$ as was provided by the interstitial digit lines 81, 83, 85 of FIG. 9. In this embodiment the sense-digit lines 104, 106 are plated along their length with a permanent magnet material such as a cobalt layer 105, 107, respectively. The cobalt layers are permanently magnetized (saturated with a large field parallel to the plane of film 100 and perpendicular to the longitudinal axis of sense-digit lines 104, 106) to form north magnetic poles along one edge of the associated cobalt layers 105, 107 and south magnetic poles on the opposing edges of the cobalt layers 105, 107 as illustrated in FIG. 11. The alternating north magnetic poles and south magnetic poles generate a spatially alternating-directioned DC digit bias field, $-H_B$, $+H_B$, $-H_B$, $+H_B$, $-H_B$, etc., along the word lines 108, 109, 110, 111, 112 thus eliminating the need for the $-H_B$ bias drivers 60, 62 and the $+H_B$ bias driver 61 illustrated in FIG. 4. Also illustrated in FIG. 11 are a ground plane 114 and a keeper layer 116 including the illustrated magnetic images of sense-digit lines 104_a_, 106_a_ and the magnetic images of cobalt layers 105_a_, 107_a_.

What is claimed is:

1. A method of converting magnetic domains into field stabilized domains in a planar magnetizable film that is of a thickness insufficient to permit the existence of interdomain Bloch walls or cross-tie walls and that has an easy axis in the plane of the film, the magnetization of which is, except in the magnetic domains, oriented substantially parallel to said easy axis and in a first direction and in said magnetic domains is oriented substantially parallel to said easy axis but in a second direction opposite to said first direction, a word line inductively coupled to said film and oriented with its longitudinal axis substantially parallel to said easy axis and a digit line inductively coupled to said film and oriented with its longitudinal axis subsstantially orthogonal to the longitudinal axis of said word line, the intersection of said word line and said digit line defining a memory area in said film and locating an associated magnetic domain thereat, said method comprising coupling a continuous, spatially alternating bias field in the plane of said film, which bias field is oriented substantially parallel to said word line and in the area of said digit line is oriented in said second direction but on both sides of said digit line is oriented in said first direction.

2. The method of claim 1 in which said word line and, accordingly, said bias field, is oriented substantially 10° out of alignment with said easy axis.

3. In a thin-ferromagnetic-planar-film memory in which the film is substantially continuous in two orthogonal directions and is of a thickness that is insufficient to permit the existence of interdomain Bloch walls of cross-tie walls, said film having an easy axis and in which information is stored in magnetic domains located at associated memory areas that are defined by the intersections of a word line and orthogonally oriented digit lines, the method of stabilizing said magnetic domains, comprising inductively coupling to said film an in-plane static, spatially alternating bias field that is substantially parallel to said word line and in the memory areas at said intersections is oriented in a first direction, but in the area between said intersections is oriented in a second direction opposite to said first direction.

4. The method of claim 3 in which said word line and, accordingly, said bias field is oriented 5°–20° out of alignment with said easy axis.

5. In a memory system incorporating a continuous thin-ferromagnetic-film of an insufficient thickness to permit the existence of interdomain Bloch walls or cross-tie walls and having the property of uniaxial anisotropy for providing an easy axis along which the remanent magnetization thereof is aligned in the plane of the film in a first or a second and opposite direction representative of a first or of a second informational state, respectively, and a plurality of parallel word lines having their longitudinal axes oriented substantially parallel to said easy axis and a plurality of parallel digit lines having their longitudinal axes oriented substantially orthogonal to said word lines, each word line, digit line intersection forming an associated memory area in the film in which magnetic domains having their magnetization aligned along said easy axis in said second direction are selectively written by concurrent AC word field $H_{AC}$ and an alternative bipolar digit pulse field $+H_D$ or $-H_D$, the improvement comprising:

- generating in the plane of said film and between adjacent ones of said digit lines a negative field stabilized domain erasing continuous DC digit bias field $-H_B$.
- generating in the plane of said film and beneath said digit lines a positive, field stabilized domain aiding continuous DC digit bias field $+H_B$;
- converting said magnetic domains into field stabilized domains by aid in-plane, alternatingdirectioned continuous DC digit bias fields $-H_B$ and $+H_B$.

6. The memory system improvement of claim 5 further including rotating the longitudinal axes of said word lines out of alignment with said easy axis for causing the positive maximum extension of said AC word field $H_{AC}$ to extend in the $+H_T$ direction into but not beyond the trough formed by the rotational switching threshold and the creep switching threshold of the switching curve of said film.

7. The memory system improvement of claim 6 in which said word lines are rotated substantially 10° out of alignment with said easy axis.

8. A memory system, comprising:

a continuous thin-ferromagnetic-film having a property of uniaxial anisotropy providing an easy axis along which the remanent magnetization thereof is aligned in a first or a second and opposite direction representative of a first or of a second informational state, respectively, and being of a thickness insufficient to permit the existence of interdomain Bloch walls or cross-tie walls, the magnetization of said film being initially aligned along said easy axis in said first direction;

a plurality of word lines inductively coupled to said film and oriented with their longitudinal axes substantially parallel to said easy axis;

a plurality of digit lines inductively coupled to said film and oriented with their longitudinal axes substantially orthogonal to the longitudinal axes of said word lines, alternate ones of said digit lines being designated sense-digit lines;

said sense-digit lines and said word lines forming a plurality of intersections for defining an associated memory area in said film at each of said intersections and locating an associated magnetic domain thereat;

$-H_B$ bias driver means coupling a continuous DC digit bias field current signal to said digit lines for generating a negative, field stabilized domain erasing DC digit bias field $-H_B$ in the areas of said film along said digit lines;

$+H_B$ bias driver means coupling a continuous DC digit bias field current signal to said sense-digit lines for generating a positive, field stabilized domain aiding DC digit bias field $+H_B$ in the areas of said film along said sense-digit lines;

the positive, field stabilized domain aiding continuous DC digit bias field $+H_B$ in the areas of said film along said sense-digit lines and the negative, field stabilized domain erasing continuous DC digit bias field $-H_B$ in the areas of said film along said digit lines that are interstatial said sense-digit lines cooperating for converting said magnetic domains in said memory areas into field stabilized domains.

9. The memory system of claim 8 in which the longitudinal axes of said word lines are rotated out of alignment with said easy axis for causing the positive maximum extension of said AC word field $H_{AC}$ to extend in the $+H_D$ direction into but not beyond the trough formed by the rotational switching threshold and the creep switching threshold of the switching curve of said film.

10. The memory system of claim 9 in which the said word lines are rotated substantially 10° out of alignment with said easy axis.

* * * * *

UNITED STATES PATENT AND TRADEMARK OFFICE

CERTIFICATE OF CORRECTION

PATENT NO. : 3,954,034

DATED : June 15, 1976

INVENTOR(S) : Ernest J. Torok, et al

It is certified that error appears in the above-identified patent and that said Letters Patent are hereby corrected as shown below:

Column 10, Line 10, "of" should be --or--.

Column 10, Line 19, "area" should be --areas--.

Column 10, Line 52, "aid" should be --said-- AND "alternatingdirectioned" should be --alternating-directioned--

Signed and Sealed this

Fourteenth Day of September 1976

[SEAL]

*Attest:*

RUTH C. MASON
*Attesting Officer*

C. MARSHALL DANN
*Commissioner of Patents and Trademarks*